(12) United States Patent
Alexander et al.

(10) Patent No.: US 6,798,666 B1
(45) Date of Patent: Sep. 28, 2004

(54) INTRODUCING LOSS IN A POWER BUS TO REDUCE EMI AND ELECTRICAL NOISE

(75) Inventors: Arthur Ray Alexander, Valley Center, CA (US); James L. Drewniak, Rolla, MO (US)

(73) Assignee: NCR Corporation, Dayton, OH (US)

( * ) Notice: Subject to any disclaimer, the term of this patent is extended or adjusted under 35 U.S.C. 154(b) by 166 days.

(21) Appl. No.: 09/752,352

(22) Filed: Dec. 29, 2000

(51) Int. Cl.[7] ................................................. H05K 1/16
(52) U.S. Cl. ...................... 361/766; 174/260; 174/262; 361/738; 361/761; 361/763; 361/793
(58) Field of Search ................................. 174/260, 250, 174/262, 263, 266; 366/793, 760, 738, 761, 763, 766, 782, 792, 794, 818, 821, 734, 306.2, 767, 777, 809; 333/12, 185, 246, 247

(56) References Cited

U.S. PATENT DOCUMENTS

| | | | | |
|---|---|---|---|---|
| 4,179,797 A | * | 12/1979 | Johnson | 29/610.1 |
| 4,870,746 A | * | 10/1989 | Klaser | 29/620 |
| 5,110,664 A | * | 5/1992 | Nakanishi et al. | 174/255 |
| 5,428,506 A | * | 6/1995 | Brown et al. | 361/794 |
| 5,635,761 A | * | 6/1997 | Cao et al. | 257/700 |
| 5,670,824 A | * | 9/1997 | Weinberg | 257/723 |
| 5,708,569 A | * | 1/1998 | Howard et al. | 361/760 |
| 5,898,576 A | * | 4/1999 | Lockwood et al. | 361/782 |
| 5,966,294 A | * | 10/1999 | Harada et al. | 361/794 |
| 6,021,050 A | * | 2/2000 | Ehman et al. | 361/793 |
| 6,061,222 A | * | 5/2000 | Morris et al. | 361/111 |
| 6,104,258 A | * | 8/2000 | Novak | 333/22 R |
| 6,198,362 B1 | * | 3/2001 | Harada et al. | 333/12 |
| 6,215,372 B1 | * | 4/2001 | Novak | 333/12 |
| 6,297,965 B1 | * | 10/2001 | Sasaki et al. | 361/782 |
| 6,418,030 B1 | * | 7/2002 | Yamaguchi et al. | 361/760 |
| 6,418,031 B1 | * | 7/2002 | Archambeault | 174/255 |

* cited by examiner

*Primary Examiner*—Kamand Cuneo
*Assistant Examiner*—J B Patel
(74) *Attorney, Agent, or Firm*—John D. Cowart

(57) ABSTRACT

A printed circuit board includes a power layer for use in providing electrical power to circuit components and a ground layer for use in carrying electrical current away from the circuit components. A loss element connects electrically between the power layer and ground layer to suppress electrical noise caused by changes in current flow in the circuit components.

6 Claims, 2 Drawing Sheets

INTRODUCING LOSS IN A POWER BUS TO REDUCE EMI AND ELECTRICAL NOISE

BACKGROUND

Multi-layer printed circuit boards (PCBs) include many layers of conductive material, such as copper, separated by layers of insulating material. Many of these PCBs include power and ground layers formed from planes of copper, where the entire plane is dedicated to either power or ground. Digital integrated circuit (IC) devices mounted to the PCBs connect to these power and ground planes to establish electrical current, or power, in the IC devices.

When IC devices in a PCB switch ON (ie., transition from the logic "0" state to the logic "1" state), the devices suddenly begin drawing current from the power bus. Likewise, current flow in the IC devices stops suddenly when the devices switch OFF. When high-speed IC devices are involved, these sudden surges in current create high frequency transients and electrical noise on the power bus. In general, this electrical noise manifests itself in two ways: (1) As radiated electromagnetic energy that escapes the PCB and interferes with the operation of other system components; and (2) as internal noise that disrupts the function of other circuits on the PCB.

SUMMARY

A printed circuit board includes a power layer for use in providing electrical power to circuit components and a ground layer for use in carrying electrical current away from the circuit components. A loss element connects electrically between the power layer and ground layer to suppress electrical noise caused by changes in current flow in the circuit components.

Other features and advantages will become apparent from the description and claims that follow.

DETAILED DESCRIPTION

A standard technique for mitigating the effects of noise and electromagnetic interference (EMI) in a multi-layer PCB involves placing one or more decoupling capacitors between the power and ground planes. However, the wire, trace, and via interconnects of axial-lead capacitors and the via, trace and package interconnects of surface-mount technology (SMT) capacitors create series inductance that limits the performance of the capacitors at high frequencies and fast edge rates. As a result, when an IC device draws current from the power bus, the PCB experiences a relatively large amount of electrical noise and ringing. Introducing additional loss in the current path drastically reduces both the external and internal effects of this electrical noise and ringing.

Figure 1:
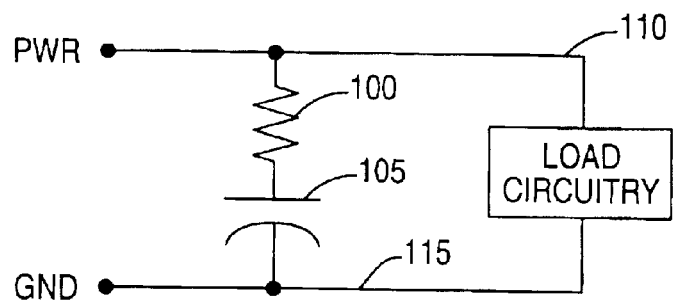
FIG. 1 is a schematic diagram of a circuit having a loss element and a decoupling capacitor connected in series between power and ground lines.

FIG. 1 shows one technique for introducing loss into the current path in a multilayer PCB. A low-value resistor 100, typically on the order of 1–10 ohms, is used to provide a slight load on the power source. In the example shown here, the resistor 100 is connected in series with a decoupling capacitor 105 between the power and ground lines 110, 115. As shown below, the resistor 100 is placed on the same PCB layer as the capacitor 105 in some embodiments and on a different layer in other embodiments. The tolerance of the resistor 100 is not performance-limiting and thus is of little importance.

Figure 2:
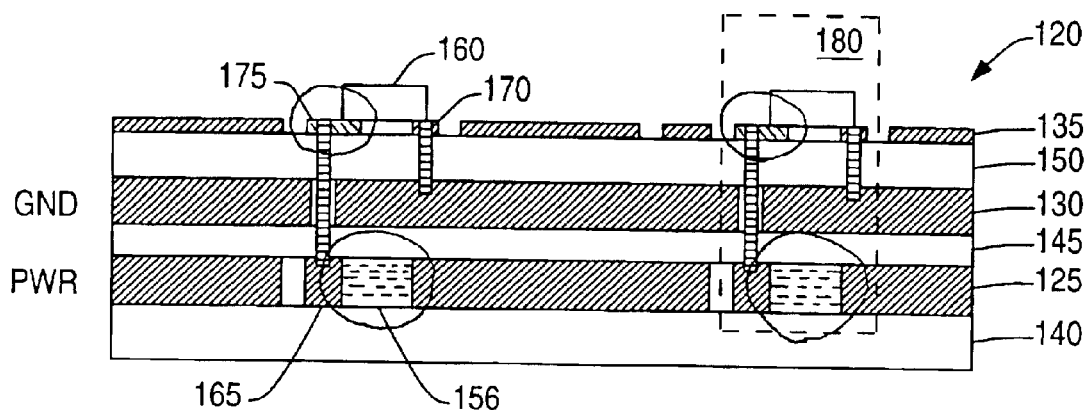
FIG. 2 is a partial cross-sectional view of a multi-layer printed circuit board having loss elements connected between power and ground planes.

FIG. 2 shows a multi-layer PCB 120 that includes an additional loss element between power and ground. The PCB 120 includes several electrically conductive layers 125, 130, 135 formed on a substrate 140 and separated by insulating layers 145, 150. In this example, one of the conductive layers 125 serves as a power plane, and another of the layers 130 serves as a ground plane.

At least one of the conductive layers 135 is used to route signals among electronic components on the PCB 120. A decoupling capacitor 160 is mounted on this layer. The PCB 120 also includes a loss element, such as polymer thick film (PTF) resistor 155, connected in series with the decoupling capacitor 160 between the power and ground planes 125, 130. In the example shown here, the resistor 155 connects physically to the power plane 125 and to an electrically conductive pad 165 formed within the power plane 125. The capacitor 160 connects physically to two conductive pads 170, 175. One of these pads connects electrically to the ground plane 130, and the other connects electrically to the resistor 155. In many embodiments, the PCB 120 also includes other resistor-capacitor pairs 180 connected in series between the power and ground planes.

Figure 3:
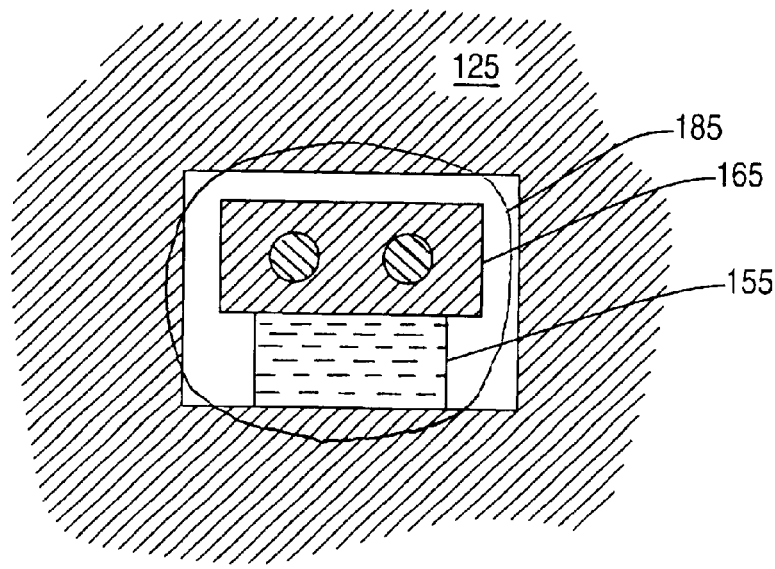
FIG. 3 is a partial plan view of a PCB layer in which a loss element is formed within a power plane.

In the example shown here, the resistor 155 is formed from a polymer film that is deposited onto the substrate 140 between the power plane 125 and the conductive pad 165. FIG. 3 shows that the pad 165 is isolated from the power plane 125 by a void 185 formed in the power plane 125 by removing material from, or "etching," this conductive layer. Polymer films are particularly suited for use in creating a resistor 155 with a very low resistance value (typically on the order of 1–10 ohms). SMT resistors and axial-lead resistors, while available in suitable values, add inductance to the circuit and thus are less effective at high frequencies. Nevertheless, other types of low-value resistors can be used instead of the PTF type of resistor shown here.

In general, the resistor 155 lies in the "shadow" of the decoupling capacitor 160 on the signal layer 135 above. Stacking the resistor 155 and capacitor 160 in this manner minimizes the impact that the resistor's presence has on routing and drilling space on the PCB 120.

Figure 4:
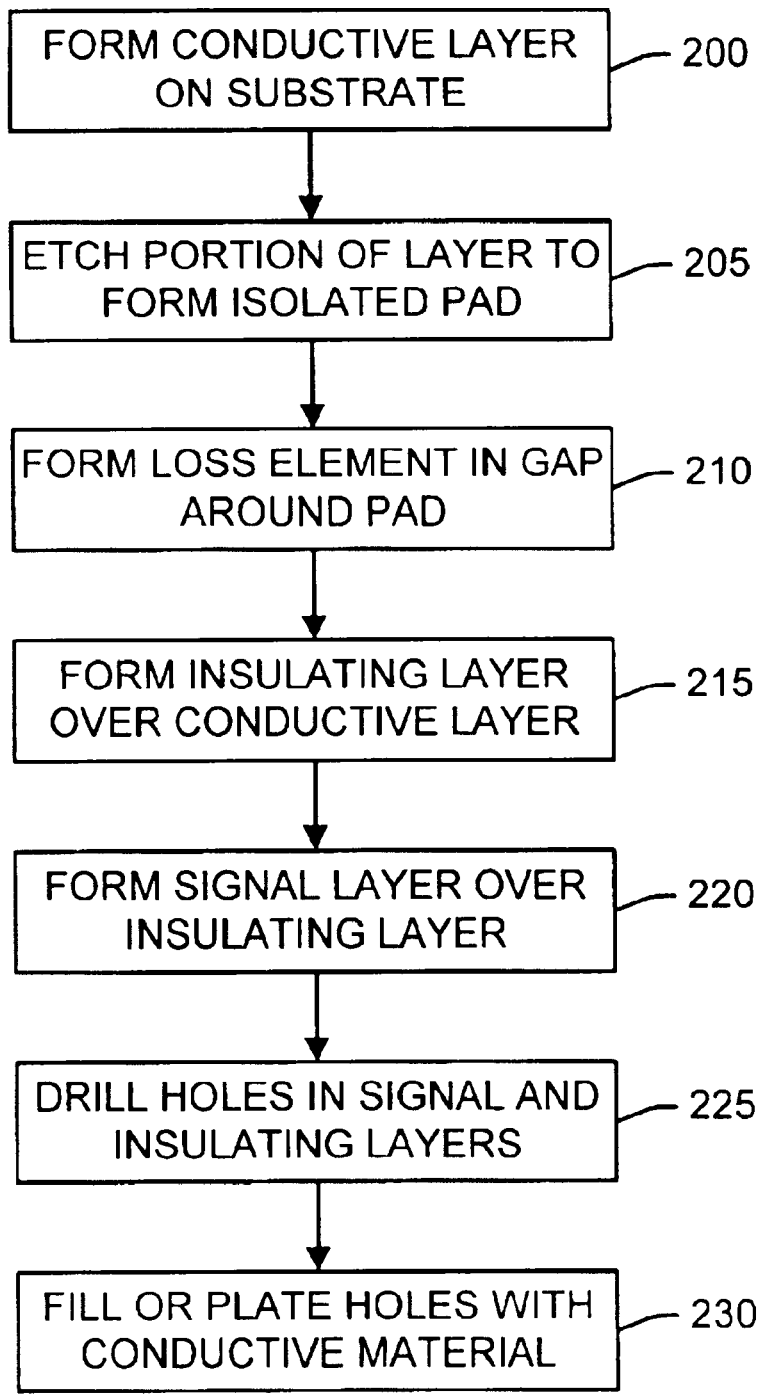
FIG. 4 is a flow chart of a technique for placing a very low value loss element on a PCB.

FIG. 4 shows a technique for embedding a loss element, such as a PTF resistor, in an internal plane of a circuit board. A conductive layer, such as that used to form a power or ground plane, is bonded onto a substrate (step 200). A portion of this layer is then etched away to form an isolated pad within the plane (step 205). A lossy material, such as a polymer film, is placed in the gap between the isolated pad and the plane surrounding it (step 210). The amount of material placed in the gap depends upon the amount of loss required. For a PTF resistor, the required resistance value governs the amount, size, and shape of polymer film placed in the gap.

At least one insulating layer is formed over the conductive plane, the isolated pad and the loss element (step 215), and at least one other conductive layer, such as that used to create a signal layer, is formed over the insulating layer (step 220). One or more holes are formed in the signal layer and the insulating layer directly above the isolated pad (step 225). These holes are then filled or plated with a conductive material to create an electrical connection between the pad and the signal layer (step 230). In most embodiments, the board includes many other circuit components and layers of material.

The text above describes one or more specific embodiments of a broader invention. This invention also is carried out in a variety of alternative embodiments and thus is not limited to those described here. For example, some embodiments place the loss element in the ground plane or in a circuit layer instead of in the power plane. Other embodiments scatter loss elements among these planes. Placing a loss element and a decoupling capacitor on the same layer, however, does not allow "stacking" the components in a manner that preserves routing and drill space. Some embodiments include many resistor-capacitor pairs scattered across the circuit board to suppress electrical noise throughout. Many other embodiments are also within the scope of the following claims.

We claim:

1. A printed circuit board that includes:
   a power layer for use in providing electrical power to circuit components;
   a ground layer for use in carrying electrical current away from the circuit components;
   a loss element residing in an internal layer of the circuit board and connected electrically between the power layer and ground layer to suppress electrical noise caused by changes in current flow in the circuit components; and
   a capacitive element connected in series with the loss element.

2. The circuit board of claim 1, where the loss element and the capacitive element reside in two different layers of the circuit board.

3. The circuit board of claim 1, where the loss element includes a resistor.

4. The circuit board of claim 3, where the resistor has a resistance value on the order of 1–10 ohms.

5. The circuit board of claim 3, where the resistor is formed from a polymer thick film (PTF) material.

6. A printed circuit board comprising multiple layers, including:
   at least one layer on which electronic circuitry resides;
   at least one power layer for use in providing electric current to the electronic circuitry, comprising:
   at least one resistive element formed in a void in the power layer and connected electrically to the power layer to suppress electrical noise created by sudden changes in current flow; and
   at least one capacitive element connected in series with the resistive element.

\* \* \* \* \*